United States Patent
Kim et al.

(10) Patent No.: US 8,677,618 B2
(45) Date of Patent: Mar. 25, 2014

(54) METHOD OF MANUFACTURING SUBSTRATE USING A CARRIER

(75) Inventors: Ki Hwan Kim, Gyunggi-do (KR); Jin Yong An, Gyunggi-do (KR); Myung Sam Kang, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 166 days.

(21) Appl. No.: 13/137,631

(22) Filed: Aug. 30, 2011

(65) Prior Publication Data

US 2011/0318480 A1 Dec. 29, 2011

Related U.S. Application Data

(62) Division of application No. 12/382,359, filed on Mar. 13, 2009, now abandoned.

(30) Foreign Application Priority Data

Dec. 17, 2008 (KR) .................. 10-2008-0128642

(51) Int. Cl.
*H05K 3/02* (2006.01)
*H05K 3/10* (2006.01)

(52) U.S. Cl.
USPC ............ 29/846; 29/830; 156/248; 156/289; 174/259

(58) Field of Classification Search
USPC ............ 29/830, 831, 846–849; 156/247, 248, 156/273.5, 275.7, 289; 174/255, 259; 216/20, 36; 427/97.4
See application file for complete search history.

(56) References Cited

U.S. PATENT DOCUMENTS

| 5,505,321 | A | | 4/1996 | Caron et al. |
| 5,691,245 | A | * | 11/1997 | Bakhit et al. .................. 216/20 |
| 6,210,518 | B1 | * | 4/2001 | Lee et al. ..................... 156/289 |
| 6,580,036 | B2 | * | 6/2003 | Kim et al. ..................... 174/255 |
| 2009/0011220 | A1 | | 1/2009 | Park et al. |
| 2010/0096171 | A1 | | 4/2010 | Lee et al. |
| 2010/0139964 | A1 | | 6/2010 | An et al. |
| 2010/0139969 | A1 | | 6/2010 | An et al. |
| 2010/0147559 | A1 | | 6/2010 | Kim et al. |

FOREIGN PATENT DOCUMENTS

| JP | 2001-308548 | 11/2001 |
| JP | 2005-243999 | 9/2005 |
| JP | 2008-277737 | 11/2008 |

OTHER PUBLICATIONS

Korean Office Action dated Aug. 31, 2010 and issued in corresponding Korean Patent Application No. 10-2008-0128642.
Japanese Office Action dated May 17, 2011 issued in corresponding Japanese Patent Application No. 2009-052545.
U.S. Patent Restriction Requirement, mailed May 10, 2011, issued in corresponding U.S. Appl. No. 12/382,359.

(Continued)

*Primary Examiner* — Donghai D. Nguyen

(57) ABSTRACT

A method of manufacturing a substrate using a carrier, that includes preparing a carrier having a releasing layer, and insulating layers and metal layers sequentially disposed on both sides of the releasing layer; patterning the metal layers to form base circuit layers; forming buildup layers on the base circuit layers; executing a routing process to separate the insulating layers from the releasing layer; and forming solder resist layers on the buildup layers and forming openings in the solder resist layers and the insulating layers to expose pads.

3 Claims, 9 Drawing Sheets

(56) References Cited

OTHER PUBLICATIONS

U.S. Patent Office Action, mailed Jun. 27, 2011, issued in corresponding U.S. Appl. No. 12/382,359.

U.S. Appl. No. 12/382,359, filed Mar. 13, 2009, Ki-Hwan Kim et al., Samsung Electro-Mechanics Co., Ltd.

U.S. Patent Office Action mailed Oct. 13, 2011 in U.S. Appl. No. 12/382,359.

* cited by examiner

METHOD OF MANUFACTURING SUBSTRATE USING A CARRIER

CROSS-REFERENCE TO RELATED APPLICATIONS

This application is a U.S. divisional application filed under 37 CFR 1.53(b) claiming priority benefit of U.S. Ser. No. 12/382,359 filed in the United States on Mar. 13, 2009, now abandoned which claims earlier priority benefit to Korean Patent Application No. 10-2008-0128642 filed with the Korean Intellectual Property Office on Dec. 17, 2008, the disclosures of which are incorporated herein by reference.

BACKGROUND

1. Field

The present invention relates to a carrier used in the manufacture of a substrate and a method of manufacturing a substrate using the carrier 2. Description of the Related Art Generally, a printed circuit board is constructed in a manner such that a board which is composed of various thermosetting synthetic resins is wired at one or both sides thereof with copper foils, IC or electronic devices are arranged and mounted on the board and electrically connected to each other and then the resulting board with the electronic devices mounted thereon is coated with an insulating material.

With an increase in demand for the miniaturization and increased functionality of electronic devices as a result of the development of the electronic industries, printed circuit boards on which the electronic devices are mounted are also required to accommodate high density wiring and to be slim.

Particularly, intensive research into a printed circuit board which is thin and a method of manufacturing the printed circuit board which are designed to reduce a total thickness thereof and thus reduce signal processing time are under vigorous progress.

In a process of manufacturing a thin substrate, a carrier which serves as a support for the thin substrate during the manufacturing process is used.

FIG. 1 shows a cross-sectional view of a conventional carrier which is adapted to be used in manufacture of a thin substrate.

As shown in FIG. 1, the conventional carrier 10 is configured such that a pair of metal bases 12a and 12b which includes respective metal barrier layers 14a and 14b thereon is attached to each other via an adhesive material 16 disposed therebetween.

In this regard, the pair of metal bases 12a and 12b may be made of metals such as copper (Cu), aluminum (Al) or iron (Fe), while the metal barrier layers 14a and 14b may be made of titanium (Ti). The metal barrier layers 14a and 14b are formed by a dry coating technique such as vacuum deposition, sputtering or ion plating. The adhesive material 16 is disposed on the other side of the metal bases 12a and 12b to connect them with each other.

FIGS. 2 to 10 are cross-sectional views sequentially showing a conventional process of manufacturing a thin substrate using the carrier shown in FIG. 1. Referring to the drawings, the process of manufacturing a thin substrate is described below.

First, first plating layers 18a and 18b are formed on the metal barrier layers 14a and 14b of the carrier 10 (FIG. 2). At this point, the first plating layers 18a and 18b may be composed of an electroless plating layer and an electrolytic plating layer.

Subsequently, the first plating layers 18a and 18b are patterned to form first circuit layers 20a and 20b (FIG. 3).

First insulating layers 22a and 22b are disposed thereon (FIG. 4).

Via-holes 24a and 24b are formed in the first insulating layers 22a and 22b so as to expose the first circuit layers 20a and 20b to the outside (FIG. 5).

Second plating layers 26a and 26b are formed on the first insulating layers 22a and 22b and inner surfaces of the via-holes 24a and 24b (FIG. 6). In this regard, each of the second plating layers 26a and 26b are composed of an electroless plating layer and an electrolytic plating layer.

The second plating layers 26a and 26b are patterned to form second circuit layers 28a and 28b (FIG. 7).

Thereafter, a routing process is conducted along routing lines RL, with the result that the pair of metal bases 12a and 12b separate from each other (FIG. 8).

The metal bases 12a and 12b and the metal barrier layers 14a and 14b are removed (FIG. 9). At this point, because the metal bases 12a and 12b and the metal barrier layers 14a and 14b are made of different materials, they are sequentially removed using different etching solutions.

Finally, solder resist layers 30a and 30b are formed on both sides of each of the first insulating layers 22a and 22b, and then openings 32a and 32b are formed in the solder resist layers 30a and 30b to allow the pads to be exposed (FIG. 10).

According to the conventional process, the carrier 10, which serves as a component being removed after completion of manufacturing, is composed of the metal bases 12a and 12b and the metal barrier layers 14a and 14b. Consequently, the conventional process is problematic in that removal of the metal bases 12a and 12b and the metal barrier layers 14a and 14b requires at least two kinds of different etching solutions and at least two etching processes.

Additionally, according to the conventional process, since the carrier which is removed after completion of manufacture of a substrate is made of expensive metal, manufacturing costs are increased.

SUMMARY

Accordingly, the present invention has been made keeping in mind the above problems occurring in the related art, and the present invention provides a carrier used in the manufacture of a substrate, which can be easily and expensively produced, and a method of manufacturing a substrate using the carrier.

Furthermore, the present invention provides a carrier used in the manufacture of a substrate, which can be efficiently used by employing the carrier as a part of the substrate, and a method of manufacturing a substrate using the carrier.

In an aspect, the present invention provides a carrier used in the manufacture of a substrate, including: a releasing layer; insulating layers disposed on both sides of the releasing layer; and metal layers disposed on the insulating layers.

The releasing layer may have a smaller length than that of the insulating layers such that the insulating layers are in contact with each other at lateral regions thereof.

The releasing layer may include first and second releasing layers, and which further comprises a reinforcing layer disposed between the first and second releasing layers.

The reinforcing layer may include a double-sided copper clad laminate or a reinforcing and insulating material.

In another aspect, the present invention provides a method of manufacturing a substrate using a carrier, including: (A) preparing a carrier comprising a releasing layer, and insulating layers and metal layers sequentially disposed on both sides of the releasing layer; (B) patterning the metal layers to form base circuit layers; (C) forming buildup layers on the base circuit layers; (D) executing a routing process to separate the insulating layers from the releasing layer; and (E) forming solder resist layers on the buildup layers and forming openings in the solder resist layers and the insulating layers to expose pads.

In (A) preparing the carrier, the releasing layer may have a smaller length than that of the insulating layers such that the insulating layers are in contact with each other at lateral regions thereof.

In (A) preparing the carrier, the releasing layer may include first and second releasing layers, and the carrier may further include a reinforcing layer disposed between the first and second releasing layers.

The reinforcing layer may include a double-sided copper clad laminate or a reinforcing and insulating material.

In (D) executing the routing process, the routing process may be executed along routing lines positioned inside the lateral regions at which the insulating layers are in contact with each other so as to separate the insulating layers from the releasing layer.

BRIEF DESCRIPTION OF THE DRAWINGS

The above and other features and advantages of the present invention will be more clearly understood from the following detailed description taken in conjunction with the accompanying drawings, in which.

DESCRIPTION OF EMBODIMENTS

Figure 1:
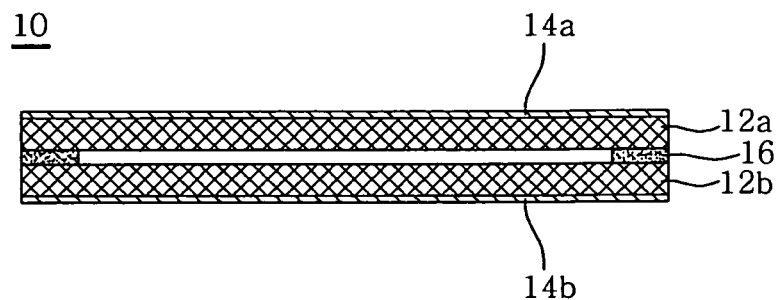
FIG. 1 is a cross-sectional view of a conventional carrier.
Figure 2:
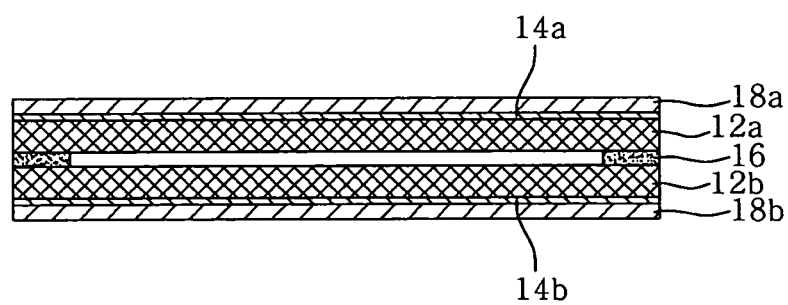
FIGS. 2 to 10 are cross-sectional views showing a conventional process of manufacturing a thin substrate using the carrier shown in FIG. 1.
Figure 3:
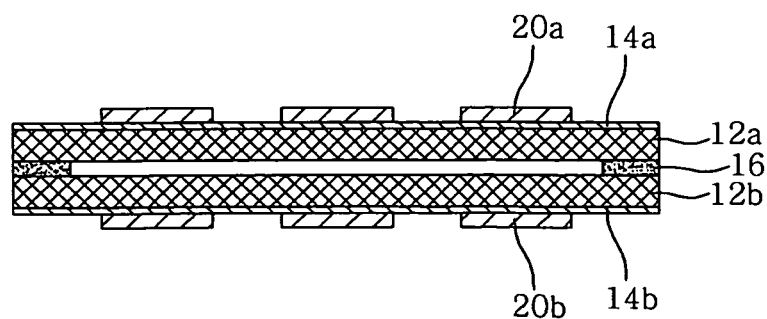
Figure 4:
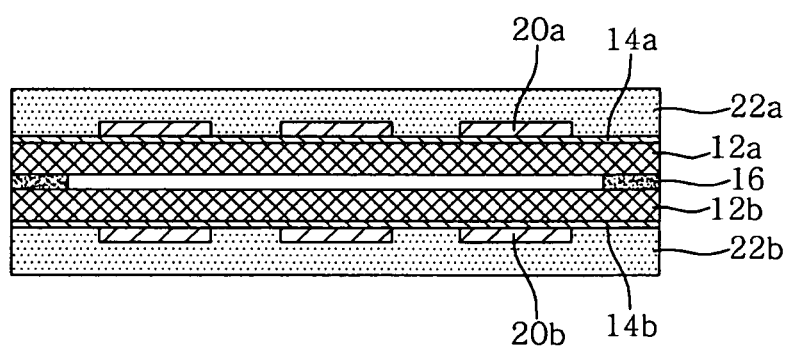
Figure 5:
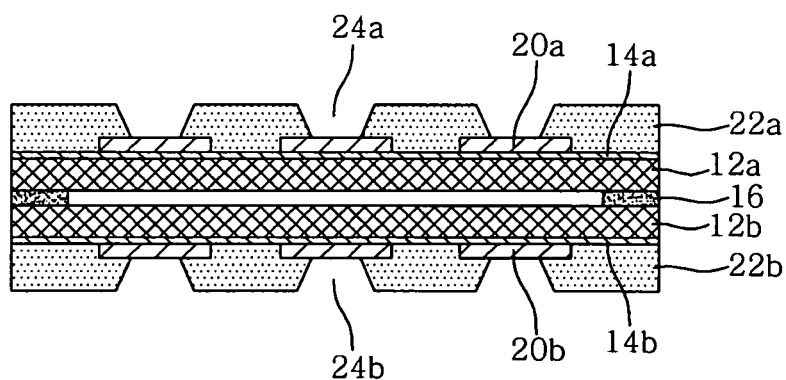
Figure 6:
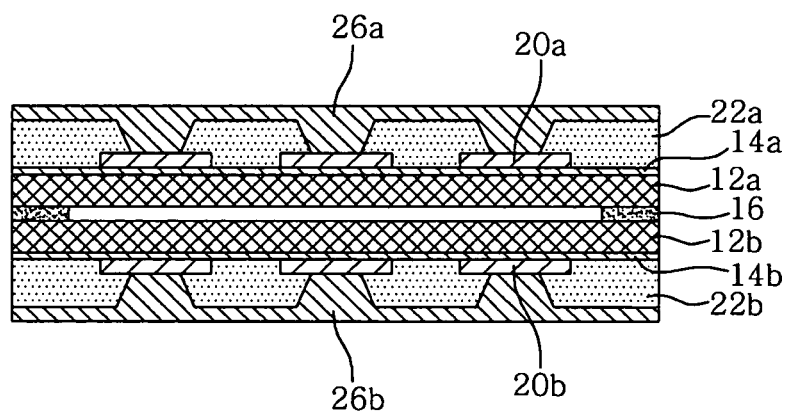
Figure 7:
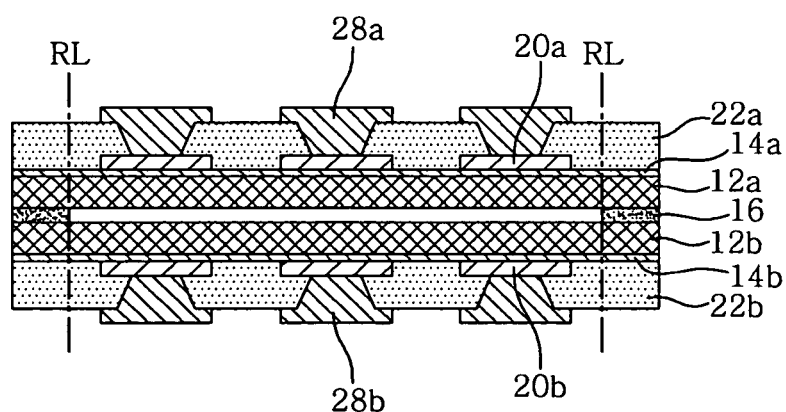
Figure 8:
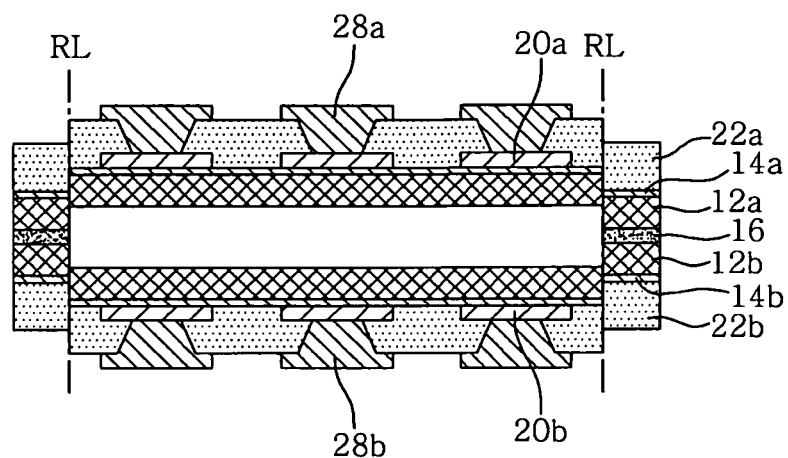
Figure 9:
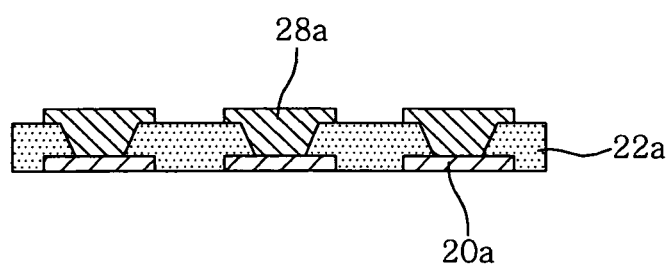
Figure 10:
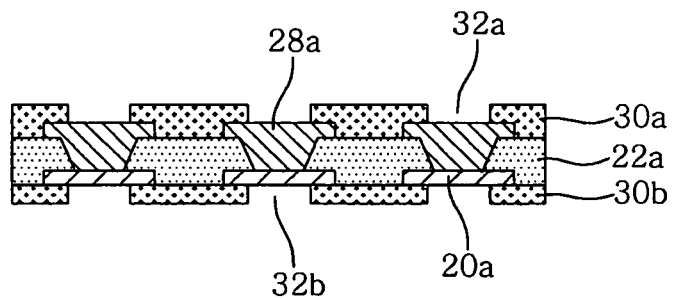

Various advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

In the following detailed description, it should be noted that the terms "first", "second" and the like are not intended to indicate a specific amount, sequence or significance but are intended to differentiate constituent elements. Furthermore, concerning the designations of reference numerals, it should be noted that the same reference numerals are used throughout the different drawings to designate the same or similar components. Also, in the description of the present invention, when it is considered that the detailed description of a related prior art may obscure the gist of the present invention, such a detailed description is omitted.

Hereinafter, embodiments of the present invention will be described in greater detail with reference to the accompanying drawings.

Carrier used in the Manufacture of a Substrate

Figure 11:
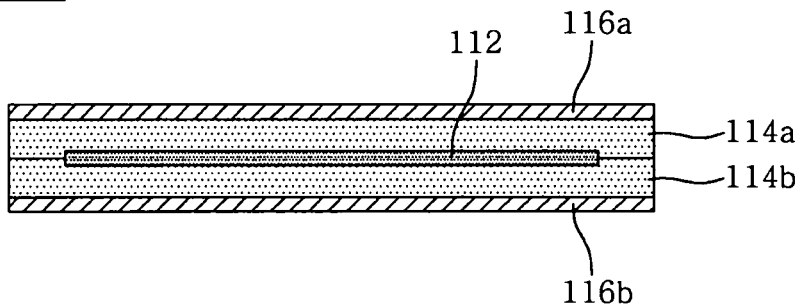
FIG. 11 is a cross-sectional view of a carrier used in the manufacture of a substrate according to a first embodiment of the present invention.
Figure 12:
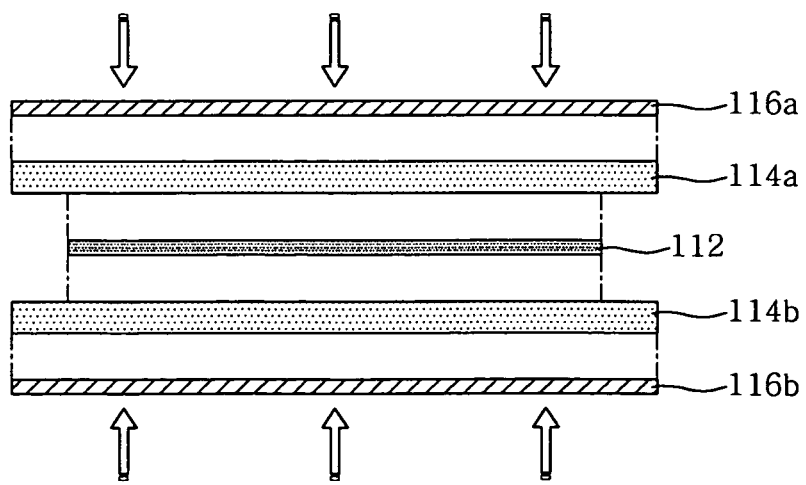
FIG. 12 is a cross-sectional view showing a process of manufacturing the carrier shown in FIG. 11.

FIG. 11 is a cross-sectional view of a carrier used in the manufacture of a substrate according to a first embodiment of the present invention, and FIG. 12 is a cross-sectional view showing a process of manufacturing the carrier used in the manufacture of a substrate as shown in FIG. 11. Referring to the drawings, the carrier 100*a* for manufacture of a substrate and a method of manufacturing the carrier 100*a*, according to this embodiment are described below.

As shown in FIG. 11, the carrier 100*a* according to this embodiment includes a releasing layer 112 on both sides of which are formed insulating layers 114*a* and 114*b* and metal layers 116*a* and 116*b*.

In this regard, the insulating layers 114*a* and 114*b* function to offer rigidity to the carrier 110*a* and to serve as solder resist layers in a subsequent process of manufacturing the substrate. For example, the insulating layers 114*a* and 114*b* may be made of ABF, prepreg or insulating material containing glass. More specifically, the present invention provides the carrier 100*a* used in the manufacture of a substrate, which includes the insulating layers 114*a* and 114*b* functioning to offer rigidity and serving as solder resist layers of the substrate, without using expensive metal components which are removed after completion of the manufacturing process as in the related art. Consequently, the present invention provides the carrier 100*a* used in the manufacture of a substrate, which enables substantial cost saving.

The releasing layer 112 is intended to allow the insulating layers 114*a* and 114*b* and the metal layers 116*a* and 116*b* to be separated from each other. The releasing layer 112 is sized to be of a shorter length than that of the insulating layers 114*a* and 114*b*, and is disposed between the insulating layers 114*a* and 114*b* excepting both lateral regions. More specifically, while the regions of the first and second insulating layers 114*a* and 114*b* at which the releasing layer 112 is formed are not adhered to each other, the remaining lateral regions of the first and second insulating layers 114*a* and 114*b* at which the releasing layer 112 is not formed are adhered to each other. Thanks to the adoption of this configuration, a subsequent routing process which is conducted along lines positioned inside the remaining lateral regions enables the first and second insulating layers 114*a* and 114*b* to be easily separated from each other. This process will be described later in greater detail with reference to FIG. 20.

In this regard, the releasing layer 112 may be made of a releasing material using a thin film coating or sputtering process.

As shown in FIG. 12, the carrier used in the manufacture of a substrate according to this embodiment is manufactured in a manner such that the insulating layers 114*a* and 114*b* and the metal layers 116*a* and 116*b* are sequentially disposed above both sides of the releasing layer 112 and are then laminated together with the releasing layer 112 using a laminator or a V-press. In other words, since the present invention applies a typical process of manufacturing a CCL to manufacture of the carrier 100*a*, the present invention obviates the need for additional equipment for manufacturing the carrier.

Figure 13:
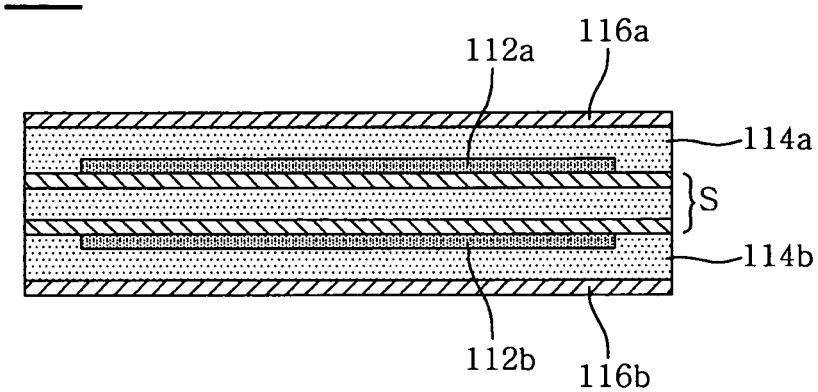
FIG. 13 is a cross-sectional view of a carrier used in the manufacture of a substrate according to a second embodiment of the present invention.
Figure 14:
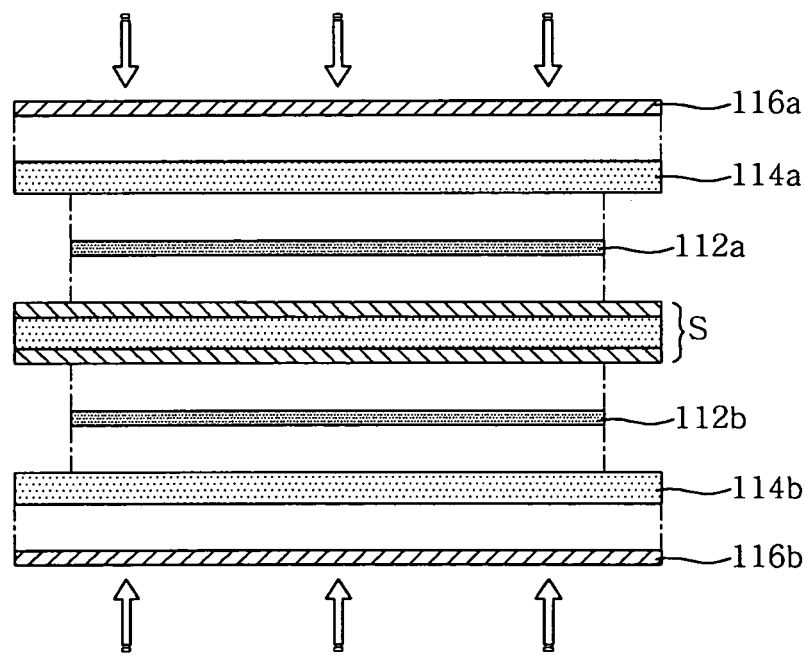
FIG. 14 is a cross-sectional view showing a process of manufacturing the carrier shown in FIG. 13.

FIG. 13 is a cross-sectional view of a carrier used in the manufacture of a substrate according to a second embodiment of the present invention, and FIG. 14 is a cross-sectional view showing a process of manufacturing the carrier used in the manufacture of a substrate as shown in FIG. 13. Referring to the drawings, the carrier 100b used in the manufacture of a substrate and a method of manufacturing the carrier 100b, according to this embodiment are described below.

As shown in FIG. 13, the carrier 100b used in the manufacture of a substrate according to this embodiment includes two releasing layers, that is, a first releasing layer 112a and a second releasing layer 112b and a reinforcing layer S disposed between the first and second releasing layers 112a and 112b, unlike the carrier 100a shown in FIG. 11. The remaining components other than these unique components are substantially identical to those of the carrier 100a usd in the manufacture of a substrate shown in FIG. 11, and thus the redundant description thereof is omitted herein.

More specifically, the carrier 100b used in the manufacture a substrate according to this embodiment is configured such that the releasing layers 112a and 112b, insulating layers 114a and 114b and metal layers 116a and 116b are sequentially disposed on both sides of the reinforcing layer S.

In this embodiment, the reinforcing layer S may be made of any material as long as the material can offer a desired rigidity to the carrier 100b for manufacture a substrate. Particularly, the reinforcing layer S may be made of any material which is easily cut in a subsequent routing process, has easy availability and lowered cost. For example, the reinforcing layer may be embodied as a double-sided copper clad laminate, as shown in FIG. 14. Although not shown in drawings, a general reinforcing and insulating material may also be used as the reinforcing layer S.

As shown in FIG. 14, the carrier 100b used in the manufacture of a substrate according to this embodiment is manufactured in a manner such that the releasing layer 112, the insulating layers 114a and 114b and the metal layers 116a and 116b are sequentially disposed above both sides of the releasing layer 112 and are then laminated using a laminator or a V-press.

Process of Manufacturing a Substrate Using the Carrier

FIGS. 15 to 21 are cross-sectional views showing a process of manufacturing a substrate using the carrier according to an embodiment of the present invention. Referring to the drawings, the process of manufacturing a substrate using the carrier according to this embodiment is described below.

Hereinafter, a process of manufacturing a substrate using the carrier 100a according to the first embodiment of the present invention as shown in FIGS. 11 and 12 will be described.

Figure 15:
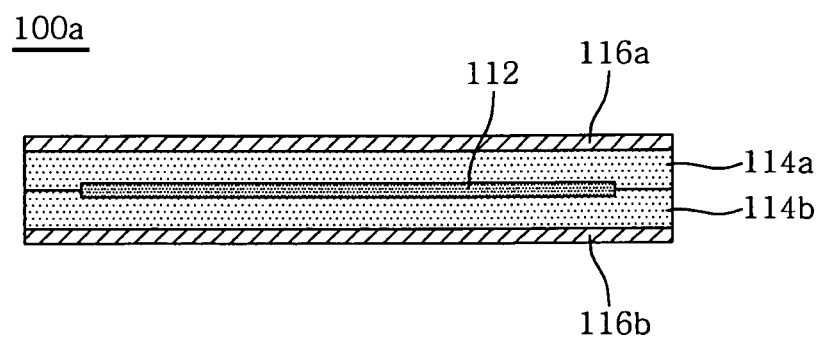
FIGS. 15 to 21 are cross-sectional views showing a process of manufacturing a substrate using the carrier according to an embodiment of the present invention

First, as shown in FIG. 15, is the preparation of the carrier 100a, which is configured such that the insulating layers 114a and 114b and the metal layers 116b and 116b are sequentially laminated on both sides of the releasing layer 112 as shown in FIG. 11.

Figure 16:
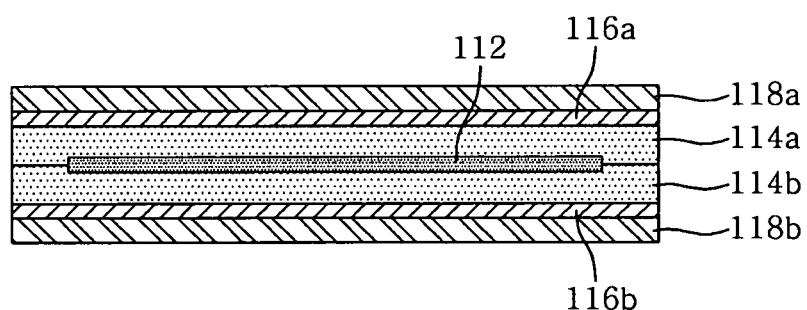

Subsequently, as shown in FIG. 16, photosensitive resist material is applied onto the metal layers 116a and 116b to provide photosensitive resist layers 118a and 118b.

At this point, the photosensitive resist layers 118a and 118b may be made of typical dry film or positive liquid photo resist (P-LPR) which is composed of a photosensitive (photoresist) film, a Mylar film disposed on a side of the photosensitive film to impart flexibility and a cover film disposed on the other side of the photosensitive film.

Figure 17:
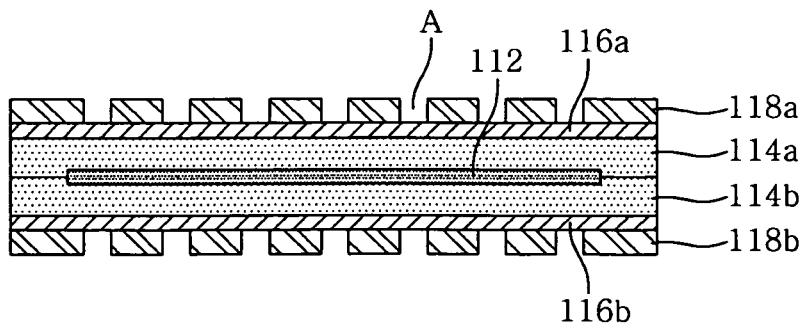

As shown in FIG. 17, the photosensitive resist layers 118a and 118b are patterned to form openings A such that the photosensitive resist layers 118a and 118b have configurations corresponding to base circuit layers 116a' and 116b' to be formed later.

At this time, the openings A may be formed in a manner such that the photosensitive resist layers 118a and 118b are partially exposed to light through a mask having a predetermined pattern and regions of the photosensitive resist layers 118a and 118b which are not exposed to the light are removed using developing solution.

Figure 18:
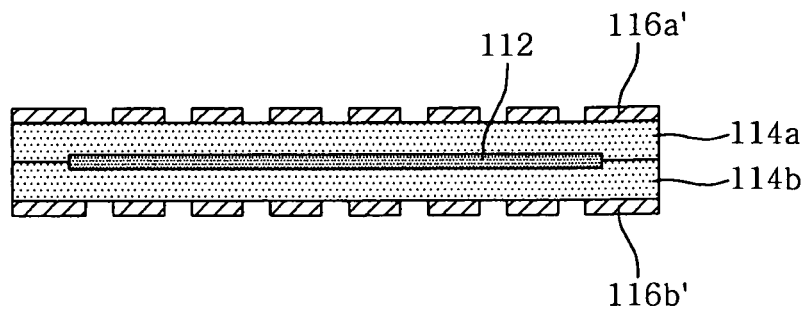

As shown in FIG. 18, regions of the metal layers 116a and 116b which are exposed through the openings A are removed through an etching process, and the photosensitive resist layers 118a and 118b are peeled off, thus forming the base circuit layers 116a' and 116b'.

The exposed regions of the photosensitive resist layers 118a and 118b are peeled off using a peeling solution such as NaOH or KOH. In this context, the peeling off of the photosensitive resist layers occurs as a result of uplifting the photosensitive resist layers 118a and 118b which occurs because of the binding of OH— of the peeling solution to the carboxyl group ($COOH^+$) of the photosensitive resist layers 118a and 118b.

Figure 19:
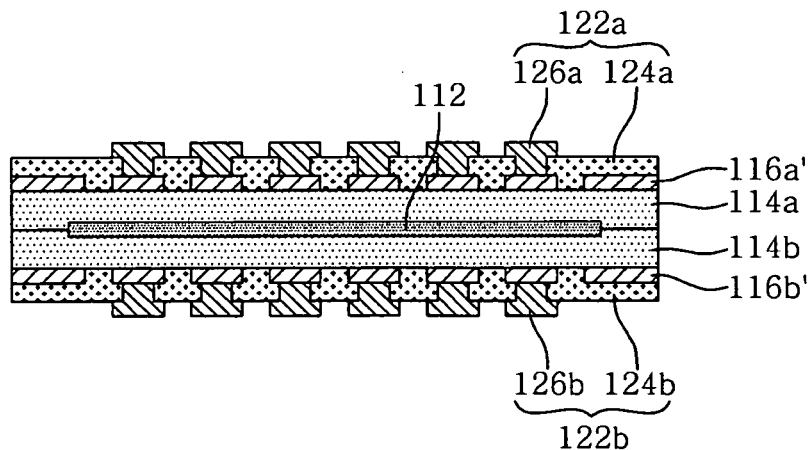

Thereafter, as shown in FIG. 19, buildup layers 122a and 122b which include buildup insulating layers 124a and 124b and buildup circuit layers 126a and 126b are formed.

At this point, the buildup layers 122a and 122b may be formed in a manner such that the buildup insulating layers 124a and 124b are formed, via-holes for interlayer connection are formed, and plating layers are formed on the buildup insulating layers 124a and 124b including inner surfaces of the via-holes and are patterned to provide the buildup circuit layers 126a and 126b.

Although each of the buildup layers 122a and 122b is shown in FIG. 19 as being composed of a single layered structure for the sake of illustration and explanation, each of the buildup layers 122a and 122b may be naturally composed of a multilayered buildup structure which must also be construed as falling within the scope of the present invention.

Figure 20:
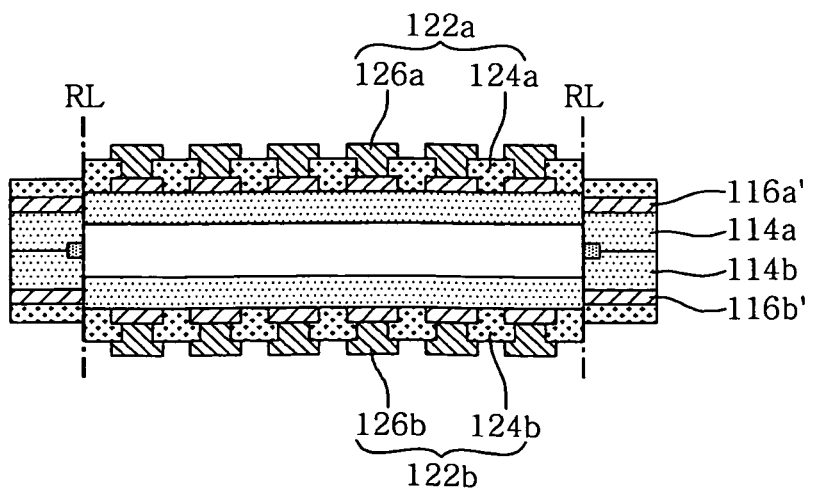

As shown in FIG. 20, a routing process is conducted along routing lines RL. In this embodiment, the routing process refers to a process of mechanically cutting a workpiece using a routing bit.

In this regard, the routing lines RL are positioned inside the lateral regions at which the first insulating layer 114a and the second insulating layer 114b adhere to each other. Therefore, the execution of the routing process along the routing lines RL allows the first and second insulating to be separated from each other by the releasing layer 112.

Figure 21:
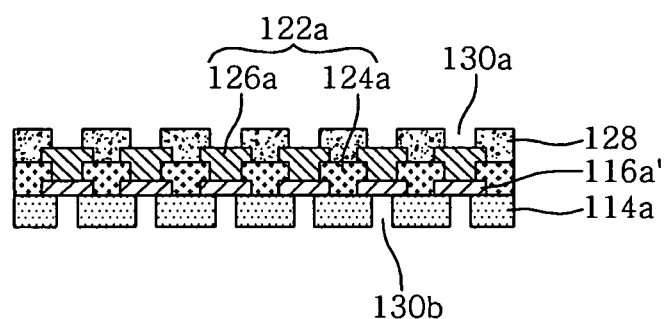

Finally, as shown in FIG. 21, a solder resist layer 128 is formed on each of the buildup layers 122a and 122b, and then openings 130a and 130b are formed in the solder resist layer 128 and each of the insulating layers 114a and 114b, respectively, to expose pads theretrough.

In this regard, since the base circuit layers 116a' and 116b' are provided with the insulating layers 114a and 114b, respectively, there is no need for formation of additional solder resist layers. In other words, since the insulating layer 114, which has served as a carrier up till this point in a typical process of manufacturing a substrate, serves as the solder resist layer 128 in the present invention, there is no need for a material and a process for formation of the solder resist layer 128, thus reducing manufacturing costs and time.

Meanwhile, the openings 130a and 130b may be formed using a machining process such as LDA (Laser Direct Ablation).

Although the process of manufacturing a substrate according to the present invention has been described as being implemented by adopting the carrier 100a according to the first embodiment, the manufacturing process may also be implemented by adopting the carrier 110b according to the second embodiment shown in FIGS. 13 and 14. The latter process of manufacturing a substrate will be apparent to the those skilled in the art from the process described with reference to FIGS. 16 to 21, and thus the detailed description thereof is omitted herein.

As described above, according to the present invention, a typical process of manufacturing a CCL is applied to a process of manufacturing a carrier used in the manufacture of a substrate, and thus there is no need for additional equipment for manufacturing the carrier. Additionally, since the carrier is manufactured using inexpensive material that is readily available, costs required to manufacture the carrier are decreased.

Furthermore, according to the present invention, since the releasing process is concurrently implemented by execution of the routing process in the manufacture of a substrate, stress caused by external force is eliminated, thus avoiding distortion of a substrate and obviating an additional releasing process.

In addition, since the insulating layers of the carrier, which are usually used to manufacture a substrate, also serve as solder resist layers of the substrate, portions of the carrier which are otherwise discarded are minimized, thus contributing to cost saving.

In addition, according to the present invention, there is no need for two kinds of etching solutions nor for conducting the etching process for removal of the carrier twice.

Although the preferred embodiments of the present invention have been disclosed for illustrative purposes, those skilled in the art will appreciate that the carrier used in the manufacture of a substrate and the method of manufacturing a substrate using the carrier are not limited thereto and various modifications, additions and substitutions are possible, without departing from the scope and spirit of the invention as disclosed in the accompanying claims. Accordingly, such modifications, additions and substitutions should also be understood to fall within the scope of the present invention

What is claimed is:

1. A method of manufacturing a substrate using a carrier, comprising:
   preparing a carrier comprising
      a reinforcing layer of cooper clad laminate,
      a first releasing layer having a smaller length than that of the reinforcing layer laminated on one surface of the reinforcing layer,
      a second releasing layer having a smaller length than that of the reinforcing layer laminated on the other surface of the reinforcing layer,
      an insulating layer laminated in the first releasing layer and the second releasing layer, and
      a metal layer laminated in the insulating layer;
   patterning the metal layers to form base circuit layers;
   forming buildup layers on the base circuit layers;
   executing a routing process cutting the buildup layers, the first releasing layer, the second releasing layer, and the reinforcing layer, and the base circuit layers simultaneously in a state in which the buildup layer is laminated in the carrier to separate the insulating layers from the releasing layers; and
   forming solder resist layers on the buildup layers and forming openings in the solder resist layers and the insulating layers to expose pads.

2. The method according to claim 1, wherein, in preparing the carrier, at least one of the releasing layers has a smaller length than that of the insulating layers.

3. The method according to claim 2, wherein, in executing the routing process, the routing process is executed along routing lines positioned inside the lateral regions at which the insulating layers are in contact with the reinforcing layer so as to separate the insulating layers from the releasing layer.

* * * * *

UNITED STATES PATENT AND TRADEMARK OFFICE
CERTIFICATE OF CORRECTION

PATENT NO.        : 8,677,618 B2  
APPLICATION NO.   : 13/137631  
DATED             : March 25, 2014  
INVENTOR(S)       : Kim et al.

Page 1 of 1

It is certified that error appears in the above-identified patent and that said Letters Patent is hereby corrected as shown below:

In the Claims

Column 8, Line 5, In Claim 1, delete "cooper" and insert -- copper --, therefor.
Column 8, Line 19, In Claim 1, after "second releasing layer," delete "and".

Signed and Sealed this
First Day of July, 2014

Michelle K. Lee
*Deputy Director of the United States Patent and Trademark Office*